United States Patent [19]

Moroni et al.

[11] Patent Number: 5,606,531
[45] Date of Patent: Feb. 25, 1997

[54] METHOD AND CIRCUIT FOR DETECTING A FAULT IN A CLOCK SIGNAL FOR MICROPROCESSOR ELECTRONIC DEVICES INCLUDING MEMORY ELEMENTS

[75] Inventors: Angelo Moroni, Villanova S. fraz. Bargano; Flavio Scarra', Agrate; Alberto Taddeo, Arenzano, all of Italy

[73] Assignee: SGS-Microelectronics, S.R.L., Agrate Brianza, Italy

[21] Appl. No.: 414,104

[22] Filed: Mar. 31, 1995

[30] Foreign Application Priority Data

Oct. 27, 1994 [EP] European Pat. Off. .............. 94830504

[51] Int. Cl.⁶ .......................................... G11C 8/00
[52] U.S. Cl. .................................. 365/233; 365/191
[58] Field of Search .................... 365/233, 191, 365/185, 226

[56] References Cited

U.S. PATENT DOCUMENTS 4,633,097 12/1986 Dewitt et al. ........................ 327/261
4,802,131 1/1989 Toyoda ................................. 365/233
5,018,111 5/1991 Madland ............................... 365/233
5,199,032 3/1993 Sparks et al. ........................ 364/707

FOREIGN PATENT DOCUMENTS 4417091 11/1994 Switzerland.

OTHER PUBLICATIONS

CA IBM Technical Disclosure Bulletin, vol. 37 No. 04B, Apr. 1994, pp. 185–188.

*Primary Examiner*—Son T. Dinh
*Attorney, Agent, or Firm*—Felsman, Bradley, Gunter & Dillon, LLP

[57] ABSTRACT

An electronic device including a microprocessor, a circuit generating a clock signal, and memories of both the volatile type and the non-volatile type, incorporates a circuit for generation of a reset signal capable of detecting a stop in the oscillation of said clock signal and generating a logic signal coupled with the reset input of the microprocessor. The circuit monitors the clock signal applied to the device and, if an irregularity is detected, generate a reset signal holding the microprocessor in a safe state. The reset signal is held until the circuit generating the clock signal resumes normal operation.

11 Claims, 2 Drawing Sheets

METHOD AND CIRCUIT FOR DETECTING A FAULT IN A CLOCK SIGNAL FOR MICROPROCESSOR ELECTRONIC DEVICES INCLUDING MEMORY ELEMENTS

CROSS REFERENCE TO RELATED APPLICATION

The present application is related to U.S. patent application Ser. No. 08/414,919, entitled "CIRCUIT FOR DETECTING A FAULT IN A CLOCK SIGNAL FOR MICROPROCESSOR ELECTRONIC DEVICES" filed of even date herewith by the inventors hereof and assigned to the assignee herein, and incorporated by reference herein.

BACKGROUND OF THE INVENTION

1. Field of the Invention

The present invention relates to a circuit for detecting irregularities in a clock signal of electronic devices containing a microprocessor and non-volatile memory elements.

The present invention concerns specifically two types of electronic device, to wit:

microcontrollers containing EEPROM or FLASH EEPROM non-volatile memories, and

FLASH EEPROM memories using internally a microprocessor for management of the reading, programming and erasing phases.

The following description is given with reference to this field of application only for the purpose of simplifying discussion thereof.

2. Description of the Prior Art

EEPROM and FLASH EEPROM memories are electrically programmable and erasable memory devices and generally comprise inside them a certain number of electrically programmable but not erasable cells. These cells constitute a small memory matrix termed UPROM (Unerasable and Programmable Read Only Memory) which is programmed by the manufacturer of the integrated circuit during testing of the device and is not visible subsequently to the user.

The UPROM is used mainly by a so-called "redundancy" circuit contained in the memory device. Said circuit permits replacement of the addresses of the rows or columns which are damaged or in any case do not possess the desired characteristics by other rows or columns termed "redundant". By means of the UPROM the manufacturer can also set the memory device configuration by choosing among the various possible configurations provided during designing. This flexibility permits suiting the device to the customer's or market requirements.

It is thus clear that programming these memory cells is entrusted exclusively to the device manufacturer and must not be permitted the user.

However if the FLASH EEPROM is integrated on a microprocessor device or if it contains inside itself a microprocessor for management of the reading, programming and erasure phases it may happen that following occurrence of an irregular situation such as failure of the clock signal, some outputs of the microprocessor are found with random logic levels. This can cause undesired effects in the device such as e.g. programming of one of the UPROM registers and irreversible corruption of the contents thereof.

To reach the high degree of reliability required today of these devices there is a tendency to equip them with circuits designed to prevent or correct any malfunctions thereof or of circuits peripheral thereto. Such malfunctions can occur during normal use of the microcontroller or memory or following incorrect use thereof, e.g. when the correct timings for the signals applied to its inputs are not respected.

In general these circuits have the function of generating a reset signal which reinitializes the microprocessor while holding it in said state until the situation returns to normal.

Generally all electronic devices comprising a microprocessor have a special external reset pin by means of which it is possible to reset the device. Normally this pin, which is connected internally to a so-called "pull-up" resistance, is connected externally to a capacitor of appropriate value so as to hold low the logic level on the reset input until the capacitor is charged. However it may happen that in irregular situations such as e.g. if the device is replaced by another without turning off power to the card the external capacitor remains charged and the new device is not correctly reset.

For this reason many devices contain a circuit known to those skilled in the art as power-on reset.

The operating principle is quite simple since the circuit output changes state and supplies a reset pulse in response to the mere rise of the supply voltage from zero to a value higher than a certain threshold and typically greater than 2,5 to 3 volts for a 5V power supply.

Generally the reset signal is generated in the microcontroller by the circuit just described and is also transferred to the exterior through a special terminal present in the device. It is thus possible to hold even peripheral circuits interfaced with the device in the reset state.

Although advantageous in certain ways this solution exhibits the following serious shortcoming. If, following a failure in the clock signal generating circuit, said signal is interrupted the power-on reset circuit does not intervene and the microcontroller stops in a random and unpredictable state. There can thus occur irregular situations in the microprocessor which can lead e.g. to writing of one of the UPROM registers and irreversible corruption of its contents.

The technical problem underlying the present invention is to provide a circuit capable of detecting clock signal irregularities and having structural and functional characteristics such as to allow increasing the reliability level of the device in which it is integrated and thus overcoming the limitations and shortcomings indicated above with reference to the prior art.

SUMMARY OF THE INVENTION

An electronic device including a microprocessor, a circuit generating a clock signal, and memories of both the volatile type and the non-volatile type, incorporates a circuit for generation of a reset signal capable of detecting a stop in the oscillation of said clock signal and generating a logic signal coupled with the reset input of the microprocessor.

The solution idea underlying the present invention is to monitor the clock signal applied to the device and, if an irregularity is detected, generate a reset signal holding the microprocessor in a safe state. The reset signal is held until the circuit generating the clock signal resumes normal operation.

The characteristics and advantages of the circuit and method in accordance with the present invention are set forth in the description of an embodiment thereof given below by way of non-limiting example with reference to the annexed drawings.

DETAILED DESCRIPTION OF THE PREFERRED EMBODIMENT

Figure 1:
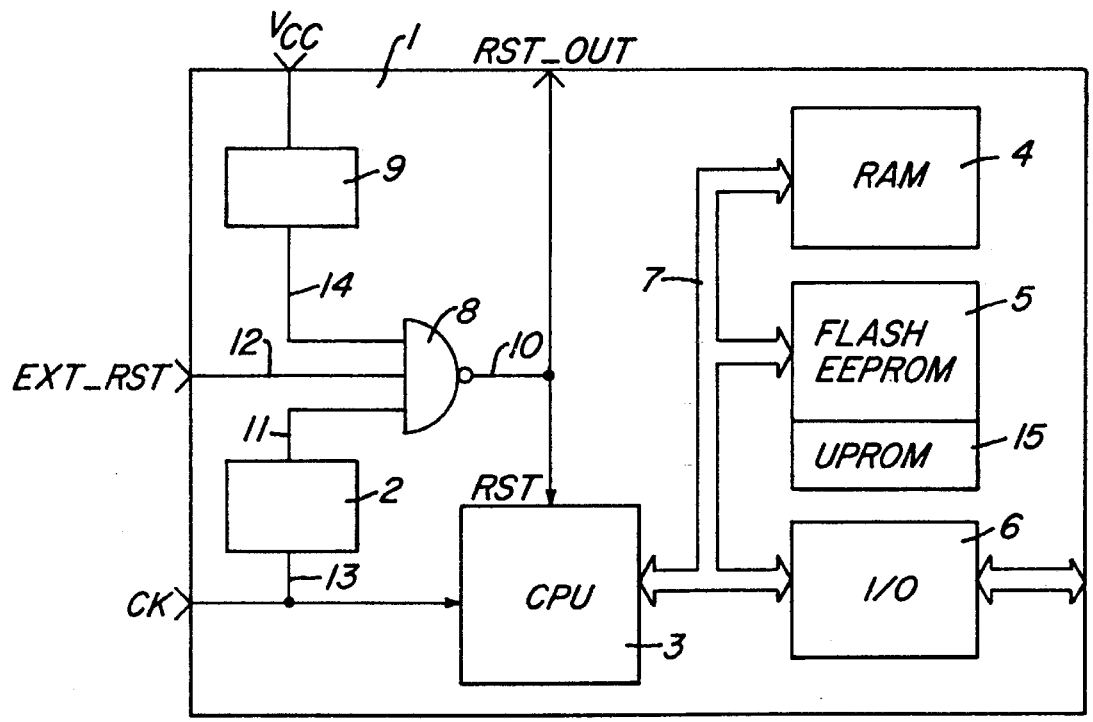
FIG. 1 shows a schematic view of the essential parts of a microcontroller incorporating a clock signal irregularity detection circuit provided in accordance with the present invention.

With reference to the figures reference number 1 indicates as a whole and schematically a first electronic device while said microcontroller comprises in a single semiconductor chip a microprocessor 3, a non-volatile memory matrix 5, a volatile memory matrix (RAM) 4, input and output ports 6 and some circuit blocks 2, 8 and 9 designed to generate a reset signal.

Blocks 3, 4, 5 and 6 communicate with each other through a group of electrical connections 7 known as data and address busses with which they are interfaced.

The non-volatile memory matrix 5 is electrically programmable and erasable and can be the EEPROM or the FLASH EEPROM type and is used for permanently memorizing the sequence of instructions for the microprocessor 3. This memory contains a certain number of cells of UPROM (Unerasable and Programmable Read Only Memory) 15 which is programmed by the manufacturer of the integrated circuit during testing of the device and subsequently is not visible to the user.

The volatile memory RAM 4 serves to temporarily store the data to be processed during execution of the program. Through the input and output communication gates 6, which are also interfaced with the bus 7, the microcontroller 3 can exchange data with external devices (nt shown).

The circuit 9 is a power-on reset circuit and generates in response to the rising ramp of the power supply voltage Vcc a logic reset signal which under normal operating conditions remains active until the supply voltage reaches a certain threshold value, e.g. 2.5V. The output of this circuit is connected to a first input 14 of a NAND logic gate 8. A second input 12 of said gate receives a reset signal coming from outside the microcontroller while a third input 11 is connected to the output of the circuit block 2. The output 10 of the NAND logic gate 8 is connected to the reset input of the microprocessor 3 and to the outside of the microcontroller through a special terminal indicated in the figures by RST_OUT.

In this manner if at least one of the three inputs of the NAND gate 8 has low logic level the microprocessor is reset.

The circuit block 2 has an input 13 connected to the terminal CK of the microcontroller and on which is applied the clock signal. Said block 2 incorporates a circuit designed to detect clock signal irregularities.

Figure 2:
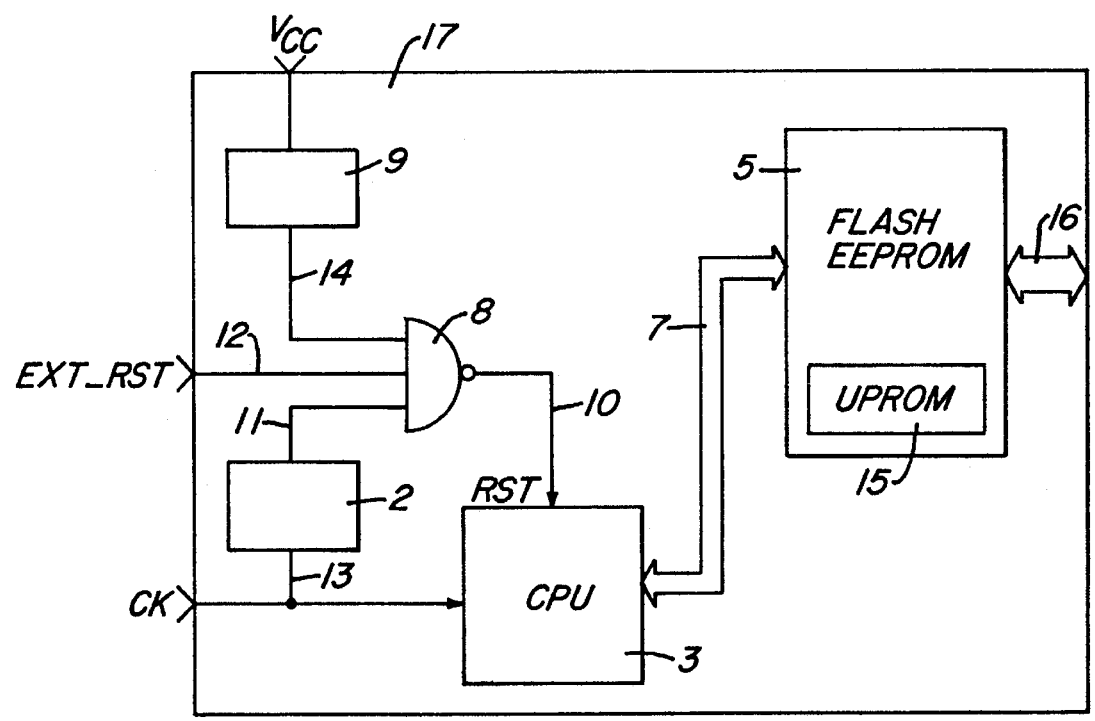
FIG. 2 shows a schematic view of the essential parts of a FLASH EEPROM controlled by a microprocessor and incorporating a clock signal irregularity detection circuit provided in accordance with the present invention.

FIG. 2 shows schematically a second electronic device 17 to which is applied the circuit in accordance with the present invention. This second device is a FLASH EEPROM in which is included, in addition to the FLASH EEPROM matrix 5, a microprocessor 3. The microprocessor 3 controls, through a group of electrical connections 7, the memory reading, programming and erasure phases.

The FLASH EEPROM matrix 5 contains a certain number of UPROM (Unerasable and Programmable Read Only Memory) cells indicated in the figures by 15. These cells are programmed by the manufacturer of the integrated circuit during testing of the device and subsequently are not visible to the user.

The power-on reset circuit 9 generates, in response to the rising ramp of the power supply voltage Vcc, a logic reset signal which under normal operating conditions remains active until the supply voltage reaches a certain threshold value, e.g. 2.5V. The output of this circuit is connected to a first input 14 of a NAND logic gate 8. A second input 12 of said gate receives a reset signal coming from outside the microcontroller while a third input 11 is connected to the output of a circuit block 2.

The output 10 of the NAND logic gate 8 is connected to the reset input of the microprocessor 3. In this manner, if at least one of the three inputs of the NAND gate 8 has low logic level, the microprocessor is reset.

The circuit block 2 has an input 13 connected to the terminal CK of the microcontroller on which is applied the clock signal. Said block 2 incorporates a circuit designed to detect clock signal irregularities.

The embodiment of the circuit block 2 is common to both the devices of FIGS. 1 and 2 and is shown in detail in FIG. 2. The input 14 of said block is connected to the control terminals of a first complementary pair of MOS transistors indicated by M1 and M2 and, through an inverting gate 15, to the control terminals of two other MOS transistors indicated by M5 and M6.

Each pair of transistors is connected in series between a positive pole of the supply voltage generator Vcc and a negative pole of said generator, i.e. to the circuit ground. In particular, the source terminal of the transistor M1 is connected to the positive pole of the power supply generator Vcc while its drain terminal is connected to the drain terminal of the transistor M2. The source terminal of the transistor M2 is connected to the circuit ground.

Similarly the source terminal of the transistor M5 is connected to the positive pole of the power supply generator Vcc while its drain terminal is connected to the drain terminal of the transistor M6. The source terminal of the transistor M6 is connected to the circuit ground.

The drain terminals of the first pair of transistors M1 and M2 are connected together in the circuit node A and are also connected to a terminal of a first capacitor C1, to the drain terminal of a transistor M3 and to a first input of an AND logic gate 16. The second terminal of the first capacitor C1 is connected to the circuit ground.

The drain terminals of the second pair of transistors M5 and M6 are connected together in the circuit node indicated by B and are also connected to a terminal of a second capacitor C2, to the drain terminal of a transistor M4 and to a second input of the logic gate 16. The second terminal of the second capacitor C2 is connected to the circuit ground.

The control terminals and source terminals of the two transistors M3 and M4 are both connected to the power supply line Vcc.

The output terminal of the logic gate 16 constitutes the output 11 of the circuit block 2.

Operation of the circuit of FIG. 2 is now described. The clock signal present at the input 14 of the circuit, typically a square-wave signal, takes into conduction the transistors M1 and M2 alternately. Consequently the circuit node A to which is also connected a terminal of the capacitor C1 is taken through the conduction resistances Ron1 and Ron2 of the two transistors M1 and M2 to the power supply voltage Vcc and to ground alternately.

In this manner the capacitor C1 is charged and discharged alternately through the two resistances Ron1 and Ron2. By dimensioning the transistors M1 and M2 in such a manner that the transistor M2 has a conduction resistance Ron2 much greater than that of Ron1 of the transistor M1, at rated operation the capacitor C1 is charged to the power supply voltage Vcc and keeps high the logic level of an input of the logic gate 16.

The input 14 of the circuit is also connected through an inverting gate 15 to the control terminals of the second pair of transistors M5 and M6. The function of these two transistors is similar to that of the two transistors M1 and M2 and is to keep the capacitor C2 charged at the power supply voltage Vcc and hence hold a second input of the logic gate 16 at a high logic level.

The two transistors M5 and M6 are dimensioned in such a manner that the internal resistance Ron5 of the transistor M5 is much greater than that of Ron6 of the transistor M6.

The output of the AND gate 16 is thus held at a high logic level during normal operation of the circuit.

If the clock signal present on the input 14 of the circuit stops at a high or low logic level one of the two transistors M2 or M6 remains in a conduction state while discharging the capacitor to which its drain terminal is connected.

If one of the two capacitors C1 or C2 is discharged, taking one of the two inputs of the logic gate 16 to a low logic level, the output of said gate changes state and passes from the high logic level to the low logic level. This logic signal is transferred through a second logic gate indicated by 8 in FIG. 1 to the reset input 10 of the microprocessor 3.

In this manner the microprocessor is held in the reset state until the clock signal is again enabled.

The two transistors M3 and M4 whose control and source terminals are connected together act as diodes and consequently conduct if the voltage on the drain terminal exceeds the voltage on the other two terminals by a certain threshold value, typically less than one volt. The function of these transistors is to rapidly discharge the two capacitors C1 and C2 in case of a sudden supply voltage interruption so as to immediately reset the microcontroller.

In this embodiment the transistors M2 and M6 are n-channel MOS transistors while the transistors M1, M3, M4 and M5 are p-channel MOS transistors.

A basic factor which intervenes in the operation of this circuit is the physical size of the transistors M1, M2, M5 and M6 in the integrated circuit. An example of sizing by which the desired characteristics are achieved is shown in the following table:

|  | M1, M5 | M2, M6 |
|---|---|---|
| W/L | 55/4 | 6/550 |
| Ron | low | high | where W indicates the width of the transistor channel, L indicates the length of the channel and Ron indicates the resistance of the transistor in conduction state. Indeed, the dimensional ratio of the width W to the length L of the channel of a transistor is one of the main factors determining internal resistance in the conduction state.

Figure 3:
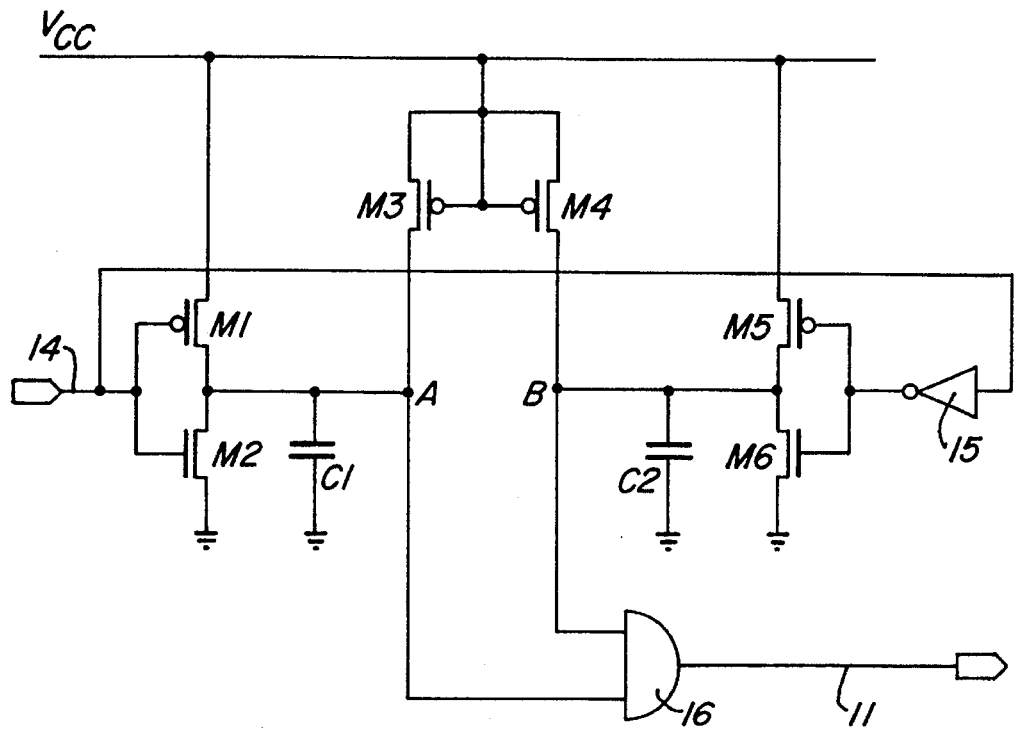
FIG. 3 shows an electrical diagram of an embodiment of the irregularity detection circuit inserted in the devices of FIGS. 1 and 2.
Figure 4:
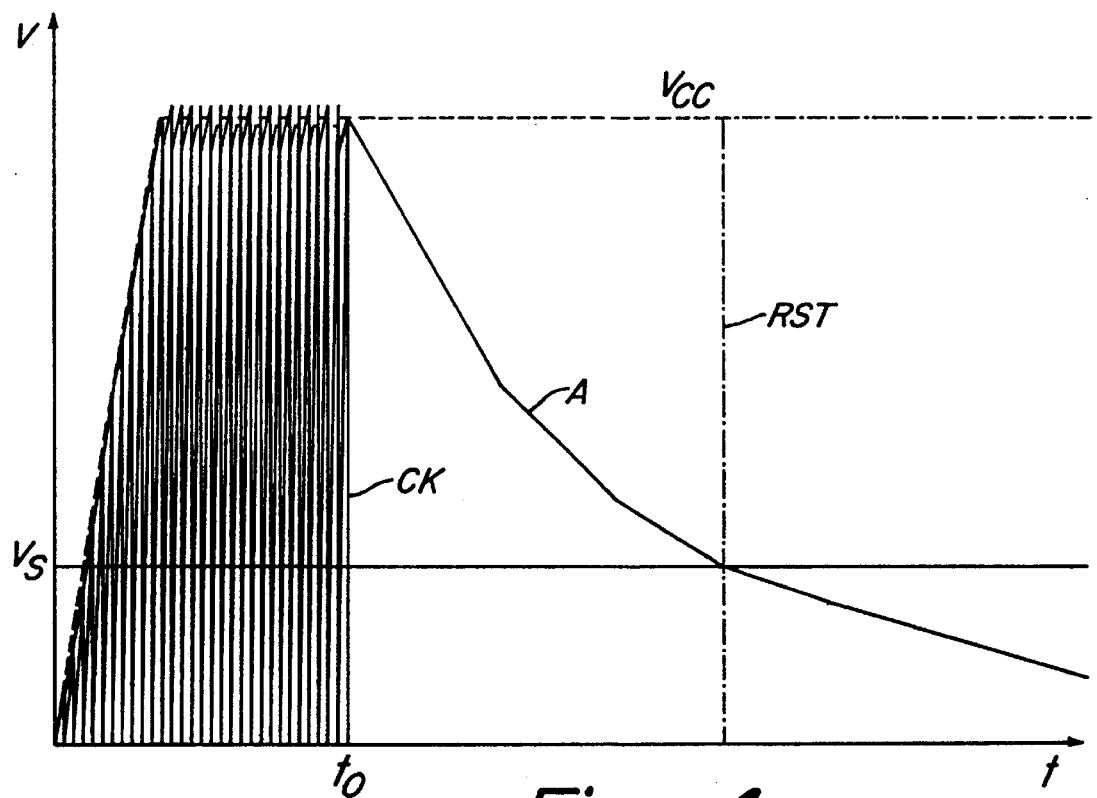
FIG. 4 shows schematically the behavior in time of a group of electrical signals present in the circuit of FIG. 3.

FIG. 4 shows the behavior in time of a group of electrical signals present in the circuit of FIG. 3. In particular it may be seen that at the instant to when the clock signal CK fails, the voltage on the circuit node A begins to fall following discharge of the capacitor C1. When this voltage falls below a certain threshold value Vs the signal RST, present at the output of the logic gate 8, passes from low logic level to high logic level, resetting the microprocessor 3. The figure also shows the level of the power supply voltage Vcc from the moment the circuit is energized.

The reset signal generation method in accordance with the present invention is now described.

As set forth in the above description the method in accordance with the present invention requires that the reset signal be applied to the microprocessor 3 as a logic function between three signals, a first logic reset signal EXT_RST coming from outside the device, a second logic signal coming from the output 14 of the power-on reset circuit 9, and a third logic signal coming from the circuit 2 capable of detecting a stop in the oscillation of the clock signal applied to the microprocessor 3.

Specifically the logic function is carried out by a NAND logic gate 8 whose output 10 is connected to the reset input RST of the microprocessor 3. In this manner if at least one of the three inputs of the NAND gate 8 is at low logic level the microprocessor is reset.

Therefore if the clock signal stops at a certain logic level, high or low, the microprocessor 3 is held in reset state until said signal resumes oscillating, overcoming the problems of the prior art discussed above.

We claim:

1. A non-volatile electrically programmable and erasable memory device including a memory cell matrix and a microprocessor interlocked with a circuit generating at least one oscillating periodic clock signal, comprising:

a circuit for generation of a reset signal for said microprocessor having an input terminal coupled with an output of the circuit generating at least one oscillating clock signal and an output terminal coupled with a reset input of the microprocessor;

wherein said circuit for generation of a reset signal detects a stop in the oscillation of said clock signal.

2. The memory device of claim 1 wherein said circuit for generation of a reset signal is detects the stop in said clock signal both at a high logic level and a low logic level.

3. The memory device of claim 2 wherein the circuit includes an output terminal and wherein the output terminal of said circuit for generation of a reset signal is connected to a first input of a logic gate having an output connected to the reset input of the microprocessor.

4. The memory device of claim 3 wherein said logic gate is an AND type logic gate having at least two input terminals and one output terminal.

5. The memory device of claim 1 wherein said circuit for generation of a reset signal comprises:

a first input stage incorporating a first complementary pair of transistors connected between a positive pole of a supply voltage generator and a negative pole of said supply voltage generator, control terminals of the first complementary pair of transistors being both connected to said input terminal and an intermediate circuit node between the transistors of the first complementary pair of transistors being connected to a first input of a logic gate having an output terminal connected to the output terminal of the circuit for generation of a reset signal;

a first capacitive element connected between the intermediate circuit node between the transistors of the first complimentary pari of transistors and a first reference potential;

a second input stage comprising a second complimentary pair of transistors connected between the positive pole and the negative pole of said supply voltage generator, control terminals of the second complimentary pair of transistors being both connected to said input terminal through an inverting gate and an intermediate circuit node between the transistors of the second complimentary pair of transistors being connected to a second input of said logic gate; and a second capacitive element connected between the intermediate circuit node between the transistors of the second complimentary pair of transistors and a second terminal connected to a second reference potential.

6. The memory device of claim 5 wherein each of said first and second complimentary pairs of transistors is made up of an n-channel MOS transistor and a p-channel MOS transistor.

7. The memory device of claim 6 wherein the p-channel MOS transistors of said first and second complimentary pairs of transistors have conduction resistances lower than the conduction resistances of the n-channel MOS transistors.

8. The memory device of claim 5 wherein said logic gate is an AND type logic gate having at least two input terminals and one output terminal.

9. The memory device of claim 5 wherein said first reference potential coincides with said second reference potential.

10. The memory device of claim 5 wherein the intermediate circuit node between the transistors of the first complimentary pair of transistors is connected through a first junction element to said positive pole of the supply voltage generator and the intermediate circuit node between the transistors of the second complimentary pair of transistors is connected through a second junction element to said positive pole of the supply voltage generator.

11. The memory device of claim 10 wherein said first and second junction elements are each provided by means of a p-channel MOS transistor.

* * * * *